(12) United States Patent
Simonazzi et al.

(10) Patent No.: US 11,700,715 B2
(45) Date of Patent: Jul. 11, 2023

(54) BATTERY CHARGER FOR VEHICLES

(71) Applicant: META SYSTEM S.p.A., Reggio Emilia (IT)

(72) Inventors: Giuseppe Simonazzi, Reggio Emilia (IT); Cesare Lasagni, Reggio Emilia (IT)

(73) Assignee: META SYSTEM S.p.A., Reggio Emilia (IT)

( * ) Notice: Subject to any disclaimer, the term of this patent is extended or adjusted under 35 U.S.C. 154(b) by 178 days.

(21) Appl. No.: 17/261,808

(22) PCT Filed: Jul. 18, 2019

(86) PCT No.: PCT/IB2019/056170
§ 371 (c)(1),
(2) Date: Jan. 20, 2021

(87) PCT Pub. No.: WO2020/016833
PCT Pub. Date: Jan. 23, 2020

(65) Prior Publication Data
US 2021/0298209 A1    Sep. 23, 2021

(30) Foreign Application Priority Data

Jul. 20, 2018 (IT) .................. 102018000007387

(51) Int. Cl.
*H05K 7/20* (2006.01)
*H02J 7/00* (2006.01)
(Continued)

(52) U.S. Cl.
CPC ........ *H05K 7/20927* (2013.01); *H02J 7/0042* (2013.01); *H02M 7/003* (2013.01); *H05K 7/1432* (2013.01); *H05K 2201/10272* (2013.01)

(58) Field of Classification Search
None
See application file for complete search history.

(56) References Cited

U.S. PATENT DOCUMENTS 10,394,292 B1 *  8/2019  Van Dyke ............. H01L 23/445
11,412,641 B2 *  8/2022  Simonazzi ......... H05K 7/20945
(Continued)

FOREIGN PATENT DOCUMENTS

DE  10 2015 113873 B3   7/2016
EP       2 006 987 A2   12/2008
(Continued)

*Primary Examiner* — Courtney L Smith
(74) *Attorney, Agent, or Firm* — Aslan Law, P.C.

(57) ABSTRACT

A battery charger for vehicles comprises one outer container, one electronic appliance housed inside the container, operatively connectable to an electric battery of a vehicle and configured for the recharge of the battery, and one cooling circuit of the electronic appliance, wherein the electronic appliance comprises one electronic board provided with an insulated metal substrate associated with the cooling circuit, with a layer of electrically insulating material made on one portion of the insulated metal substrate, and with one electronic circuit made on the layer of electrically insulating material, in which the electronic board comprises one conductive metal bar for the transport and the distribution of current, electrically connected to the electronic circuit and provided with one portion arranged in direct contact with one surface portion of the electronic board, for the cooling of the conductive metal bar by the cooling circuit.

9 Claims, 3 Drawing Sheets

(51) Int. Cl.
*H02M 7/00* (2006.01)
*H05K 7/14* (2006.01)

(56) References Cited

U.S. PATENT DOCUMENTS

| | | | | |
|---|---|---|---|---|
| 2003/0151893 A1* | 8/2003 | Meyer | ................... | H02M 7/003 |
| | | | | 361/689 |
| 2010/0078807 A1* | 4/2010 | Schulz | .................. | H01L 23/367 |
| | | | | 257/713 |
| 2012/0170217 A1* | 7/2012 | Nishikimi | .......... | H05K 7/20927 |
| | | | | 361/689 |
| 2019/0394901 A1* | 12/2019 | Esders | ............... | H05K 7/20981 |

FOREIGN PATENT DOCUMENTS

| EP | 2 328 392 A2 | 6/2011 |
|---|---|---|
| EP | 2 792 045 B1 | 2/2017 |

* cited by examiner

1

BATTERY CHARGER FOR VEHICLES

This application is a National Stage Entry of PCT/IB2019/056170 filed on Jul. 18, 2019. This application claims priority to IT Patent Application No. 102018000007387 filed on Jul. 20, 2018, and to PCT Application No. PCT/IB2019/056170 filed on Jul. 18, 2019, the entire contents of which are hereby incorporated by reference.

TECHNICAL FIELD

The present invention relates to a battery charger for vehicles.

BACKGROUND ART

With particular reference to the field of electric or hybrid vehicles, it is essential to employ power electronic appliances installed on board of vehicles for the conversion of an input voltage/current into a suitable output voltage/current, such as OBC (On-Board Charger) battery chargers or DC-DC converters.

Battery chargers for vehicles of known type generally comprise one or more power or control boards, consisting of one or more printed circuit boards.

The printed circuit boards can be made on a support made of an electrically insulating material such as epoxy-glass or on a metal support of the IMS (Insulated Metal Substrate) type.

It should be noticed, in particular, that in the field of the realization of battery chargers for vehicles, the use is preferred of printed circuit boards with a metal support because it allows achieving high thermal efficiency, due to the thermal dissipation characteristics of the metal used (generally aluminum).

The use is also well known of so-called "busbars" on the electronic boards of the battery chargers of known type, these busbars being composed of special metal bars which, connected to different points of the electronic boards and suitably sized, allow transporting and distributing high currents.

The solutions of known type do however have some drawbacks.

In fact, the busbars fitted on the battery chargers of known type must be able to transport high currents between different points of the electronic boards and, therefore, they must necessarily have a big size if compared to the rest of the electronics fitted on the boards.

As a result, this involves a not negligible amount of space of the busbars used which, given the ever-increasing need for small battery chargers, creates several complications in the design and arrangement of the battery charger's internal electronics.

DESCRIPTION OF THE INVENTION

The main aim of the present invention is to devise a battery charger for vehicles that is small in size and is, at the same time, simple and quick to assemble.

Another object of the present invention is to devise a battery charger for vehicles that can be maintained at an ideal working temperature effectively.

Another object of the present invention is to devise a battery charger for vehicles that allows overcoming the aforementioned drawbacks of the prior art within a simple, rational, easy, effective to use and low cost solution.

The aforementioned objects are achieved by the present battery charger for vehicles according to the characteristics of claim 1.

BRIEF DESCRIPTION OF THE DRAWINGS

Other characteristics and advantages of the present invention will be more evident from the description of a preferred, but not exclusive, embodiment of a battery charger for vehicles, illustrated by way of an indicative, but non-limiting example, in the attached tables of drawings in which.

EMBODIMENTS THE INVENTION

Figure 1:
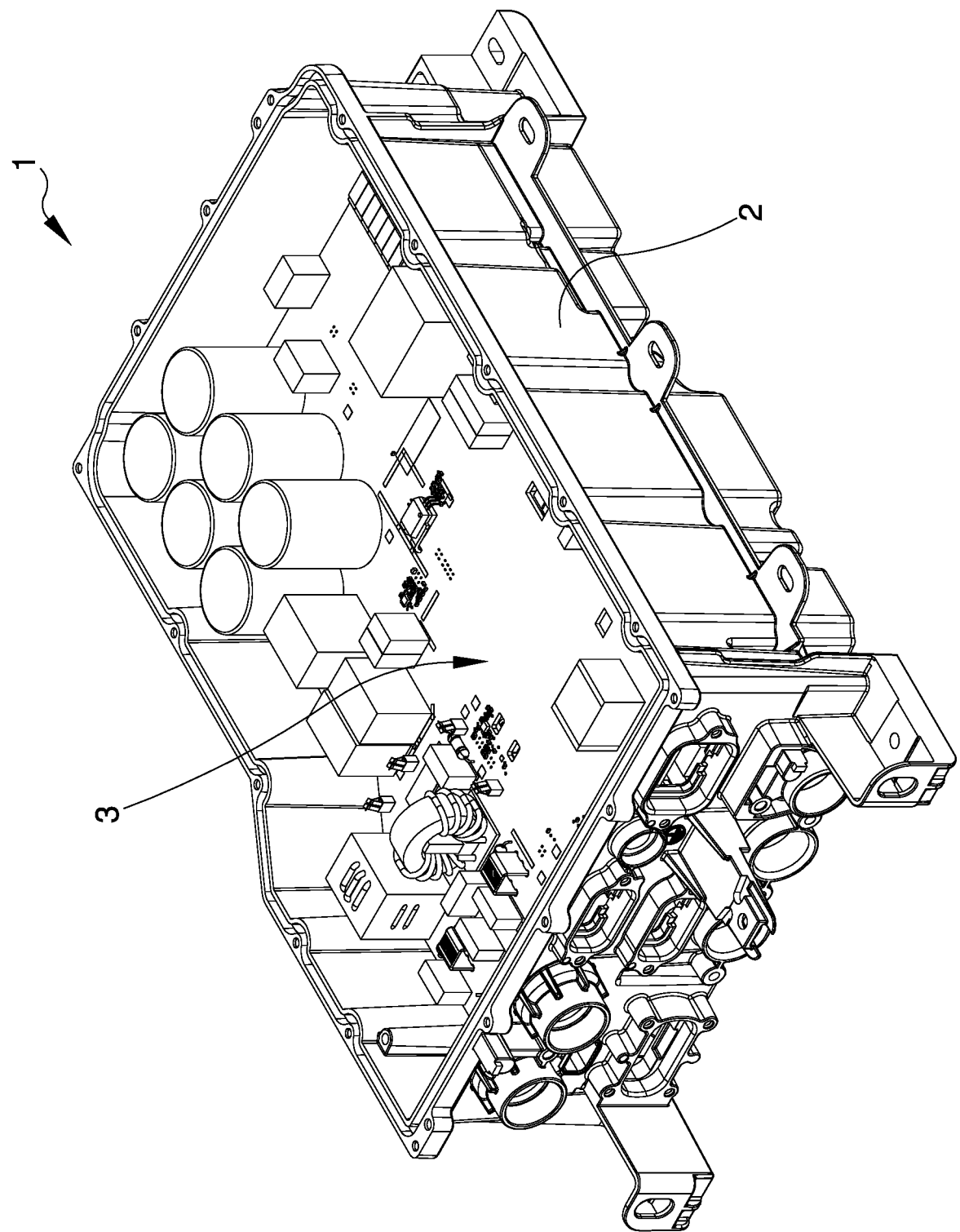
FIG. 1 is a general view of a possible battery charger according to the invention.
Figure 2:
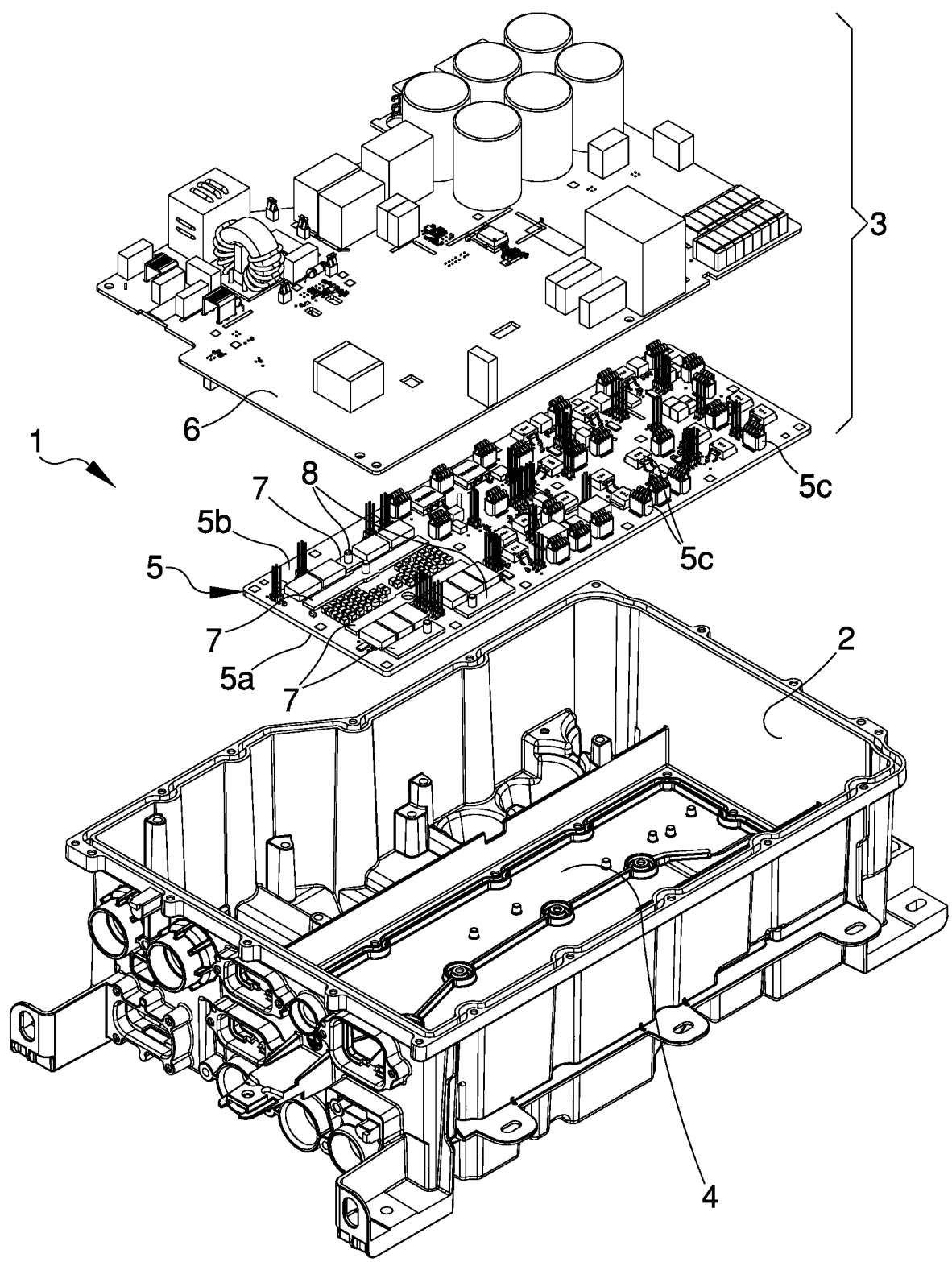
FIG. 2 is an exploded view of the battery charger of FIG. 1.
Figure 3:
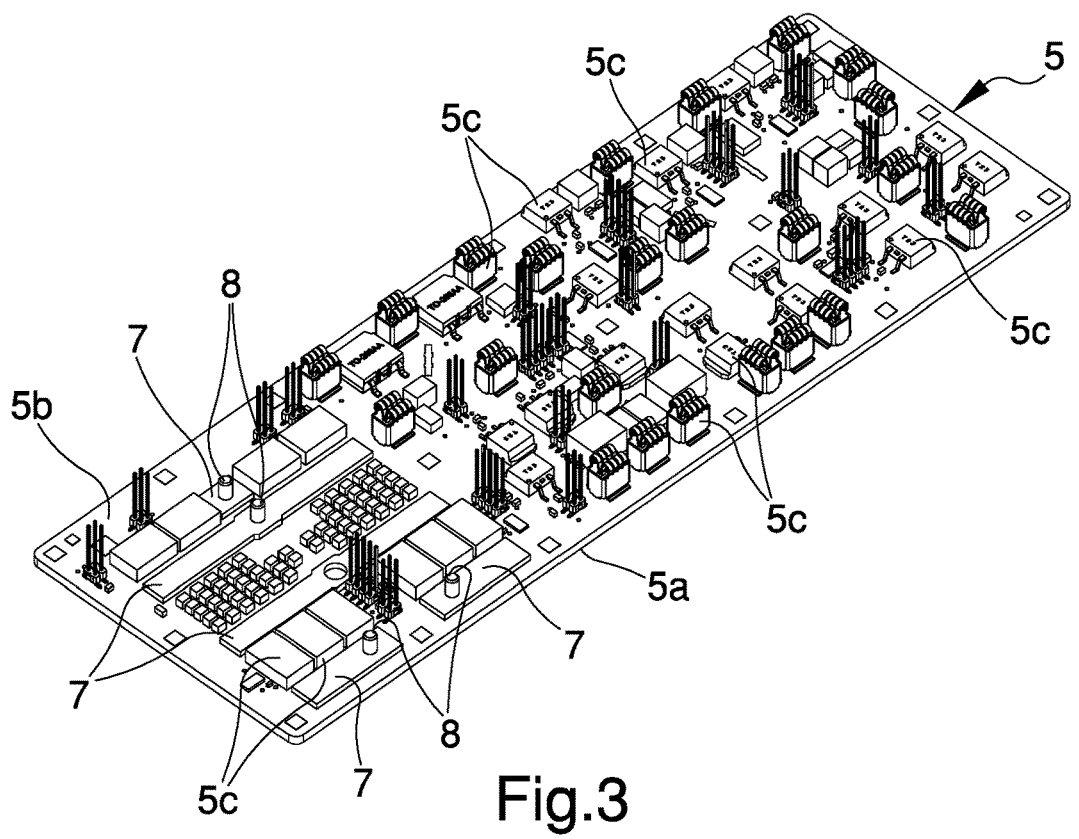
FIG. 3 is a view of an IMS (Insulated Metal Substrate) electronic board of the battery charger according to the invention.
Figure 4:
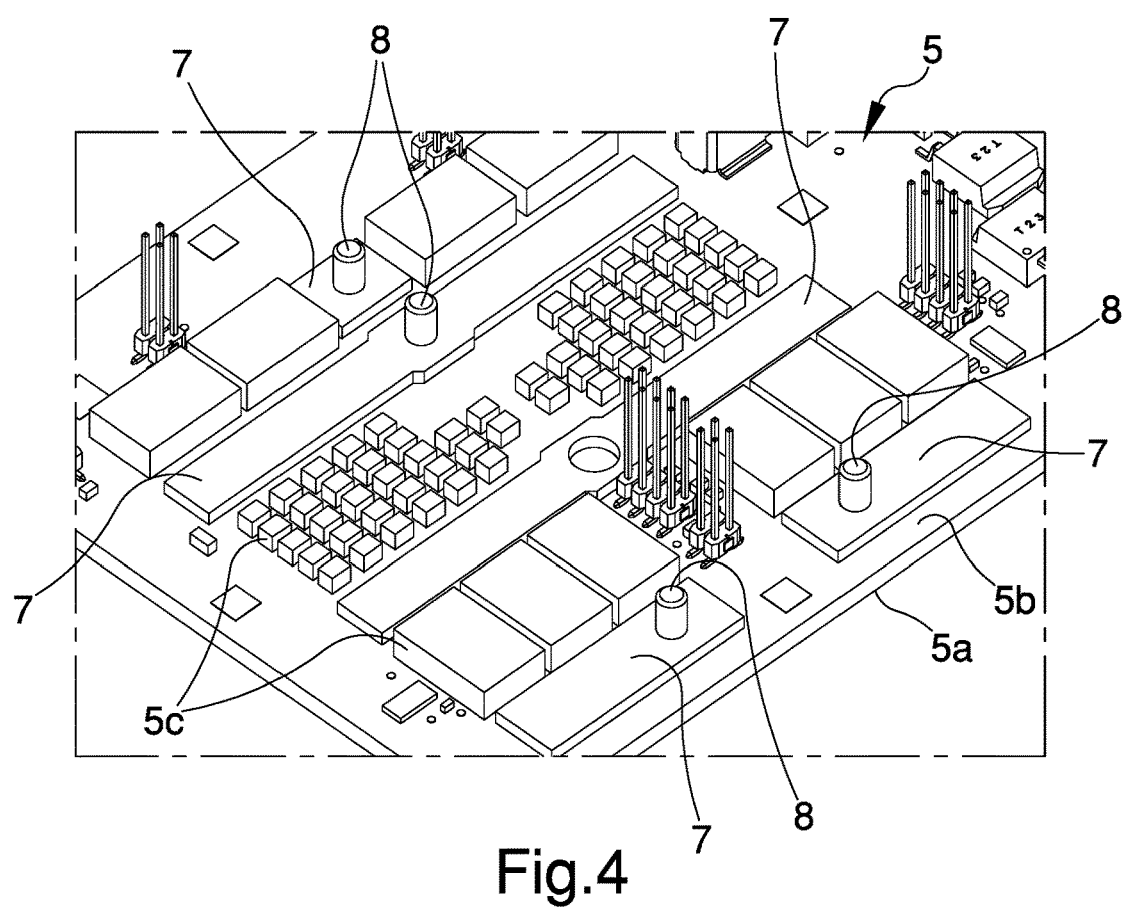
FIG. 4 shows a detail of the IMS electronic board of FIG. 3.

With particular reference to these illustrations, reference numeral 1 globally indicates a battery charger for vehicles, in particular of the type that can be installed on board of electric, hybrid or similar vehicles and adapted to recharge the battery of the vehicle.

The battery charger 1 comprises an outer container 2, adapted to house and protect the entire electronics of the battery charger itself and adapted to allow the installation and fixing thereof inside the vehicle.

The battery charger 1 comprises an electronic appliance, globally indicated with reference numeral 3 in the figures, housed inside the container 2, operatively connectable to an electric battery of a vehicle and configured for the recharge of the battery itself.

The battery charger also comprises a cooling circuit 4 to limit the temperature of the electronic appliance 3 during the use of the battery charger 1.

For example, the cooling circuit 4 can be composed of a conventional liquid cooling circuit.

According to the particular but not exclusive embodiment illustrated in the figures, the cooling circuit 4 is made directly on the bottom of the container 2.

The electronic appliance 3 comprises at least one electronic board 5 provided with an insulated metal substrate (IMS) 5a associated with the cooling circuit 4.

The electronic board 5 also comprises a layer of electrically insulating material 5b made on at least one portion of the insulated metal substrate 5a, and at least one electronic circuit 5c made on the layer of electrically insulating material 5b.

The electronic appliance 3 may comprise several electronic boards.

For example, with reference to the particular but not limited embodiment shown in the illustrations, the electronic appliance 3 comprises two electronic boards 5 and 6 wherein, in particular, the electronic board 5 is of the IMS type.

The electronic board 5 comprises at least one conductive metal bar 7 for the transport and distribution of current, electrically connected to the electronic circuit 5c.

This conductive metal bar 7 is of the type of a so-called "busbar", used to allow the transport and distribution of high currents to several different points of an electronic board.

Advantageously, the conductive metal bar 7 is provided with at least one portion arranged in direct contact with at least one surface portion of the electronic board 5.

In this way, the conductive metal bar 7 can be cooled and, therefore, maintained at a lower working temperature, during the use of the battery charger 1. In fact, the cooling circuit 4 allows cooling the insulated metal substrate 5a of the electronic board 5 and, by heat conduction, allows cooling the conductive metal bar 7.

The positioning of the conductive metal bar 7 directly onto the electronic board 5, together with the fact that the conductive metal bar 7 is cooled by means of the cooling circuit 4, by heat conduction with the insulated metal substrate 5a of the electronic board itself, allow for the use of a conductive metal bar 7 of reduced size compared to the bars of known type.

In particular, the conductive metal bar 7 is provided with a lower surface arranged in direct contact with at least one surface portion of the electronic board 5.

Preferably, the conductive metal bar 7 is substantially plate-shaped and comprises an upper surface opposite the lower surface associated with the electronic board 5.

In addition, the conductive metal bar 7 preferably has a substantially elongated shape.

Different shapes of the conductive metal bar 7 cannot however be ruled out.

With reference to the particular embodiment shown in the illustrations, the electronic board 5 comprises a plurality of conductive metal bars 7, arranged at different portions of the electronic board itself and adapted to connect different points.

Each conductive metal bar 7 extends over at least one portion of the electronic board 5, on the layer of electrically insulating material 5b.

Advantageously, each conductive metal bar 7 comprises electric coupling and connection means 8 of at least one electric connecting element. The electric connecting element, not shown in the figures, can be composed e.g. of a special cable adapted to carry a predefined electrical current on the conductive metal bar 7.

For example, the electric coupling and connection means 8 are composed of an electric terminal made at at least one portion of the conductive metal bar 7.

As shown in the figures, the terminal extends from the upper surface of the conductive metal bar 7.

The electronic board 5 described above is used inside a battery charger 1 for electric vehicles.

The use cannot however be ruled out in different applications of an electronic board similar to the electronic board 5 described above, provided with at least one conductive metal bar 7.

It has in practice been ascertained that the described invention achieves the intended objects.

In particular, the fact is underlined that the battery charger according to the invention is small in size and, at the same time, simple and quick to assemble.

In fact, the positioning of the conductive metal bar directly on the electronic board, together with the fact that the conductive metal bar is cooled by means of the cooling circuit, by heat conduction with the insulated metal substrate of the electronic board itself, allow the use of a conductive metal bar of reduced size compared to the bars of known type.

In addition, the conductive metal bar used, precisely because it is cooled down, allows the maintenance of an ideal working temperature in an effective manner.

The invention claimed is:

1. A battery charger for vehicles, the battery charger comprising:
   at least one outer container,
   at least one electronic appliance housed inside said container, operatively connectable to an electric battery of a vehicle and configured for the recharge of said battery, and
   at least one cooling circuit of said electronic appliance, wherein
   said electronic appliance comprises at least one electronic board provided with an insulated metal substrate directly connected with said cooling circuit, with a layer of electrically insulating material made on at least one portion of said insulated metal substrate, and with at least one electronic circuit made on said layer of electrically insulating material,
   said electronic board comprises at least one conductive metal bar for the transport and the distribution of current, electrically connected to said electronic circuit and provided with at least one portion arranged in direct contact with at least one surface portion of said electronic board, for the cooling of said conductive metal bar by means of said cooling circuit,
   said conductive metal bar is provided with a lower surface arranged in direct contact with at least one surface portion of said electronic board,
   said conductive metal bar comprises an upper surface opposite said lower surface associated with said electronic board, and
   said conductive metal bar extends over at least one portion of said electronic board, on said layer of electrically insulating material.

2. The battery charger according to claim 1, wherein said conductive metal bar is provided with the lower surface arranged in direct contact with said layer of electrically insulating material of said electronic board.

3. The battery charger according to claim 1, wherein said conductive metal bar (7) is substantially plate-shaped.

4. The battery charger according to claim 1, wherein said conductive metal bar has a substantially elongated shape.

5. The battery charger according to claim 1, wherein said conductive metal bar comprises electric coupling and connection means of at least one electric connecting element.

6. The battery charger according to claim 5, wherein said electric coupling and connection means comprise at least one electric terminal made at least one portion of said conductive metal bar.

7. The battery charger according to claim 6, wherein said at least one electric terminal extends from said upper surface of the conductive metal bar.

8. An electronic board comprising:
   a cooling circuit,
   an insulated metal substrate, wherein said insulated metal substrate is directly connected with the cooling circuit,
   a layer of electrically insulating material made on at least one portion of said insulated metal substrate,
   at least one electronic circuit made on said layer of electrically insulating material, and
   at least one conductive metal bar for the transport and the distribution of current, electrically connected to said electronic circuit and provided with at least one portion arranged in direct contact with at least one surface portion of said electronic board, for the cooling of said conductive metal bar by means of said cooling circuit, wherein said conductive metal bar is provided with a lower surface arranged in direct contact with at least one surface portion of said electronic board, said conductive metal bar comprises an upper surface opposite said lower surface associated with said electronic board, and said conductive metal bar extends over at least one portion of said electronic board, on said layer of electrically insulating material.

9. The electronic board according to claim 8, wherein said conductive metal bar is provided with the lower surface arranged in direct contact with said layer of electrically insulating material of said electronic board.

\* \* \* \* \*